United States Patent
Ozaki

(10) Patent No.: US 10,508,343 B2
(45) Date of Patent: Dec. 17, 2019

(54) ETCHING METHOD FOR MANUFACTURING SEMICONDUCTOR DEVICE

(71) Applicant: FUJITSU LIMITED, Kawasaki-shi, Kanagawa (JP)

(72) Inventor: Shirou Ozaki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 1213 days.

(21) Appl. No.: 14/097,721

(22) Filed: Dec. 5, 2013

(65) Prior Publication Data
US 2014/0090782 A1  Apr. 3, 2014

Related U.S. Application Data

(62) Division of application No. 13/399,241, filed on Feb. 17, 2012, now Pat. No. 8,637,409.

(30) Foreign Application Priority Data

Mar. 14, 2011 (JP) .................................. 2011-055988

(51) Int. Cl.
C23F 1/08 (2006.01)
H01L 21/311 (2006.01)
H01L 21/67 (2006.01)
H01L 21/28 (2006.01)

(52) U.S. Cl.
CPC ........... *C23F 1/08* (2013.01); *H01L 21/31111* (2013.01); *H01L 21/67086* (2013.01); *H01L 21/67115* (2013.01); *H01L 21/28167* (2013.01)

(58) Field of Classification Search
USPC ...................................... 156/345.1
See application file for complete search history.

(56) References Cited

U.S. PATENT DOCUMENTS

| | | | | |
|---|---|---|---|---|
| 5,151,252 A | * | 9/1992 | Mass | B01J 19/123 422/186.3 |
| 5,238,530 A | * | 8/1993 | Douglas | C04B 41/5353 216/62 |
| 6,500,589 B1 | * | 12/2002 | Ohtsu | G02F 1/133516 349/106 |
| 6,679,996 B1 | | 1/2004 | Yao | |
| 6,730,447 B2 | * | 5/2004 | Ito | B23K 26/04 430/22 |

(Continued)

FOREIGN PATENT DOCUMENTS

CN   1516827   7/2004
CN   1587085 A  3/2005

(Continued)

OTHER PUBLICATIONS

Chinese Office Action of Chinese Patent Application No. 201210068655.3 dated Aug. 26, 2014 with full English translation.

(Continued)

*Primary Examiner* — Kambiz Zand
*Assistant Examiner* — Mirza Israr Javed
(74) *Attorney, Agent, or Firm* — Kratz, Quintos & Hanson, LLP

(57) ABSTRACT

An etching method includes: applying a radiation to an etching aqueous solution; and etching a material to be etched by using the etching aqueous solution irradiated with the radiation.

6 Claims, 12 Drawing Sheets

(56) References Cited

U.S. PATENT DOCUMENTS

| | | | |
|---|---|---|---|
| 7,029,374 B2* | 4/2006 | Chen | B08B 7/0035 134/1.3 |
| 2003/0039894 A1 | 2/2003 | Yan et al. | |
| 2005/0074558 A1 | 4/2005 | Cho et al. | |
| 2006/0040499 A1 | 2/2006 | Walther et al. | |
| 2006/0292311 A1 | 12/2006 | Kilburn et al. | |
| 2009/0061576 A1 | 3/2009 | Okamoto | |
| 2011/0118128 A1* | 5/2011 | Garcia Tello | G01N 33/54326 506/7 |
| 2011/0127018 A1* | 6/2011 | Bahar | F25B 1/00 165/121 |
| 2012/0034395 A1 | 2/2012 | Goto | |

FOREIGN PATENT DOCUMENTS

| | | |
|---|---|---|
| CN | 1597134 | 3/2005 |
| CN | 101006198 | 7/2007 |
| JP | 2001-237212 | 8/2001 |
| JP | 2002334856 A | 11/2002 |
| JP | 2007201014 A | 8/2007 |
| JP | 2009-177007 A1 | 8/2009 |
| JP | 2010-232423 | 10/2010 |
| JP | 2012035188 A | 2/2012 |
| TW | 200714374 | 4/2007 |
| TW | 200731018 | 8/2007 |

OTHER PUBLICATIONS

Chinese Office Action of Chinese Patent Application No. 201210068655.3 dated Mar. 4, 2014 with English translation of Office Action.

Taiwanese Office Action issued Taiwanese Patent Application No. 101105965 dated Feb. 6, 2014 with Full Translation.

Korean Office Action issued for Korean Patent Application No. 10-2012-0022852 dated Dec. 31, 2013 with Full Translation.

Korean Office action dated Jun. 19, 2013, in the counterpart patent application No. 10 2012-0022852, with English translation.

J.A. Bardwell et al., "Ultraviolet photoenhanced wet etching of GaN in $K_2S_2O_8$ solution", Journal of Applied Physics, vol. 89, year 2001, pp. 4142-4149.

Japanese Office Action of Japanese Patent Application No. 2011-055988 dated Sep. 16, 2014 with partial English translation.

* cited by examiner

FIG. 2

| CHEMICAL BOND | BINDING ENERGY (eV) | WAVELENGTH (nm) |
|---|---|---|
| H-OH | 4.6 | 268 |
| H-F | 5.6 | 220 |

FIG. 3

$$2TiO_2 \xrightarrow{h\nu} TiO_2(h^+) + TiO2(e^-)$$

$$TiO_2(h^+) + H_2O \rightarrow TiO_2H^+ + OH$$

FIG. 4

| CHEMICAL BOND | BINDING ENERGY (eV) | WAVELENGTH (nm) |
|---|---|---|
| Al-O | 5.3 | 234 |
| Hf-O | 8.3 | 149 |

FIG. 10

| | LAYER TO BE ETCHED | ETCHING AQUEOUS SOLUTION | CONCENTRATION (PERCENT BY MASS) | ULTRAVIOLET RAY | | AVERAGE ETCHING RATE (nm/min) | IN-PLANE UNIFORMITY (nm/min) |
| --- | --- | --- | --- | --- | --- | --- | --- |
| | | | | WAVELENGTH (nm) | ILLUMINANCE (mW/cm$^2$) | | |
| ETCHING 1 | ALUMINUM OXIDE | HYDROFLUORIC ACID AQUEOUS SOLUTION | 10 | 172 | 10 | 3.8 | 0.3 |
| ETCHING 2 | ALUMINUM OXIDE | POTASSIUM HYDROXIDE AQUEOUS SOLUTION | 6 | 172 | 10 | 3.0 | 0.2 |
| ETCHING 3 | ALUMINUM OXIDE | TMAH AQUEOUS SOLUTION | 2.38 | 172 | 10 | 3.6 | 0.2 |
| ETCHING 4 | HAFNIUM OXIDE | HYDROFLUORIC ACID AQUEOUS SOLUTION | 10 | 172 | 10 | 2.7 | 0.2 |
| ETCHING 5 | ALUMINUM OXIDE | HYDROFLUORIC ACID AQUEOUS SOLUTION | 10 | – | – | 2.4 | 0.3 |
| ETCHING 6 | ALUMINUM OXIDE | POTASSIUM HYDROXIDE AQUEOUS SOLUTION | 6 | – | – | 1.8 | 0.3 |
| ETCHING 7 | ALUMINUM OXIDE | TMAH AQUEOUS SOLUTION | 2.38 | – | – | 2.0 | 0.4 |
| ETCHING 8 | HAFNIUM OXIDE | HYDROFLUORIC ACID AQUEOUS SOLUTION | 10 | – | – | 1.6 | 0.2 |

FIG. 12

| | LAYER TO BE ETCHED | ETCHING AQUEOUS SOLUTION | CONCENTRATION (PERCENT BY MASS) | ULTRAVIOLET RAY | | AVERAGE ETCHING RATE (nm/min) |
|---|---|---|---|---|---|---|
| | | | | WAVELENGTH (nm) | ILLUMINANCE (Mw/cm²) | |
| ETCHING 11 | ALUMINUM OXIDE | HYDROFLUORIC ACID AQUEOUS SOLUTION | 10 | 172 | 10 | 3.4 |
| ETCHING 12 | ALUMINUM OXIDE | POTASSIUM HYDROXIDE AQUEOUS SOLUTION | 6 | 172 | 10 | 2.8 |
| ETCHING 13 | ALUMINUM OXIDE | TMAH AQUEOUS SOLUTION | 2.38 | 172 | 10 | 3.3 |
| ETCHING 14 | HAFNIUM OXIDE | HYDROFLUORIC ACID AQUEOUS SOLUTION | 10 | 172 | 10 | 2.5 |
| ETCHING 15 | ALUMINUM OXIDE | HYDROFLUORIC ACID AQUEOUS SOLUTION | 10 | — | — | 2.4 |
| ETCHING 16 | ALUMINUM OXIDE | POTASSIUM HYDROXIDE AQUEOUS SOLUTION | 6 | — | — | 1.8 |
| ETCHING 17 | ALUMINUM OXIDE | TMAH AQUEOUS SOLUTION | 2.38 | — | — | 2.0 |
| ETCHING 18 | HAFNIUM OXIDE | HYDROFLUORIC ACID AQUEOUS SOLUTION | 10 | — | — | 1.6 |

ETCHING METHOD FOR MANUFACTURING SEMICONDUCTOR DEVICE

CROSS-REFERENCES TO RELATED APPLICATIONS

This application is a Divisional application of Ser. No. 13/399,241 filed on Feb. 17, 2012, which claims the benefit of priority from Japanese Patent Application No. 2011-55988 filed on Mar. 14, 2011, the entire contents of both of which are incorporated herein by reference.

FIELD

The embodiments relate to an etching method, a method for manufacturing a semiconductor device, and an etching device.

BACKGROUND

As a transistor element is miniaturized, a gate insulating film becomes thinner.

As the gate insulating film becomes thinner, a leakage current may increase and the reliability of operation of the transistor element may be reduced.

Related art is disclosed in Japanese Laid-open Patent Publication No. 2009-177007 and the like.

SUMMARY

According to an aspect of the embodiments, an etching method includes: applying a radiation to an etching aqueous solution; and etching a material to be etched by using the etching aqueous solution irradiated with the radiation.

Additional advantages and novel features of the invention will be set forth in part in the description that follows, and in part will become more apparent to those skilled in the art upon examination of the following or upon learning by practice of the invention.

BRIEF DESCRIPTION OF DRAWINGS

FIG. 2 illustrates an exemplary relationship between a chemical bond and a binding energy of an etching aqueous solution.

FIG. 3 illustrates an exemplary facilitation mechanism of generation of active species.

FIG. 4 illustrates an exemplary relationship between a chemical bond and a binding energy of a layer to be etched.

FIG. 10 illustrates an exemplary average etching rate and in-plane uniformity.

FIG. 12 illustrates an exemplary etching rate.

DESCRIPTION OF EMBODIMENTS

A high dielectric material is used as a material for forming a gate insulating film. Since the gate insulating film having a high dielectric constant is used, the thickness of the insulating film is increased while the electrical characteristics are maintained so that a leakage current may be reduced.

Examples of the high dielectric materials for forming the gate insulating film may include aluminum oxide and hafnium oxide.

In the manufacturing process of a transistor element, for example, a high dielectric film provided with a patterned resist layer is etched and a gate insulating film is formed.

For example, wet etching by using an etching aqueous solution may be employed. The etching selectivity between the high dielectric film and a layer under the high dielectric film may be given to the etching aqueous solution by pH adjustment, addition of a catalyst, or the like with respect to the etching aqueous solution. The high dielectric film is wet etched and the gate insulating film is produced.

Regarding the wet etching, the etching rate of the high dielectric film with the etching aqueous solution is small and, therefore, formation of a gate oxide film may take much time.

The high dielectric film may be etched through dry etching using plasma or the like. The etching rate of dry etching of the high dielectric film may be larger than that of wet etching. Regarding the dry etching, the etching selectivity between the high dielectric film and a layer under the high dielectric film is low and, therefore, the layer under the high dielectric film may be etched together with the high dielectric film.

Figure 1A:
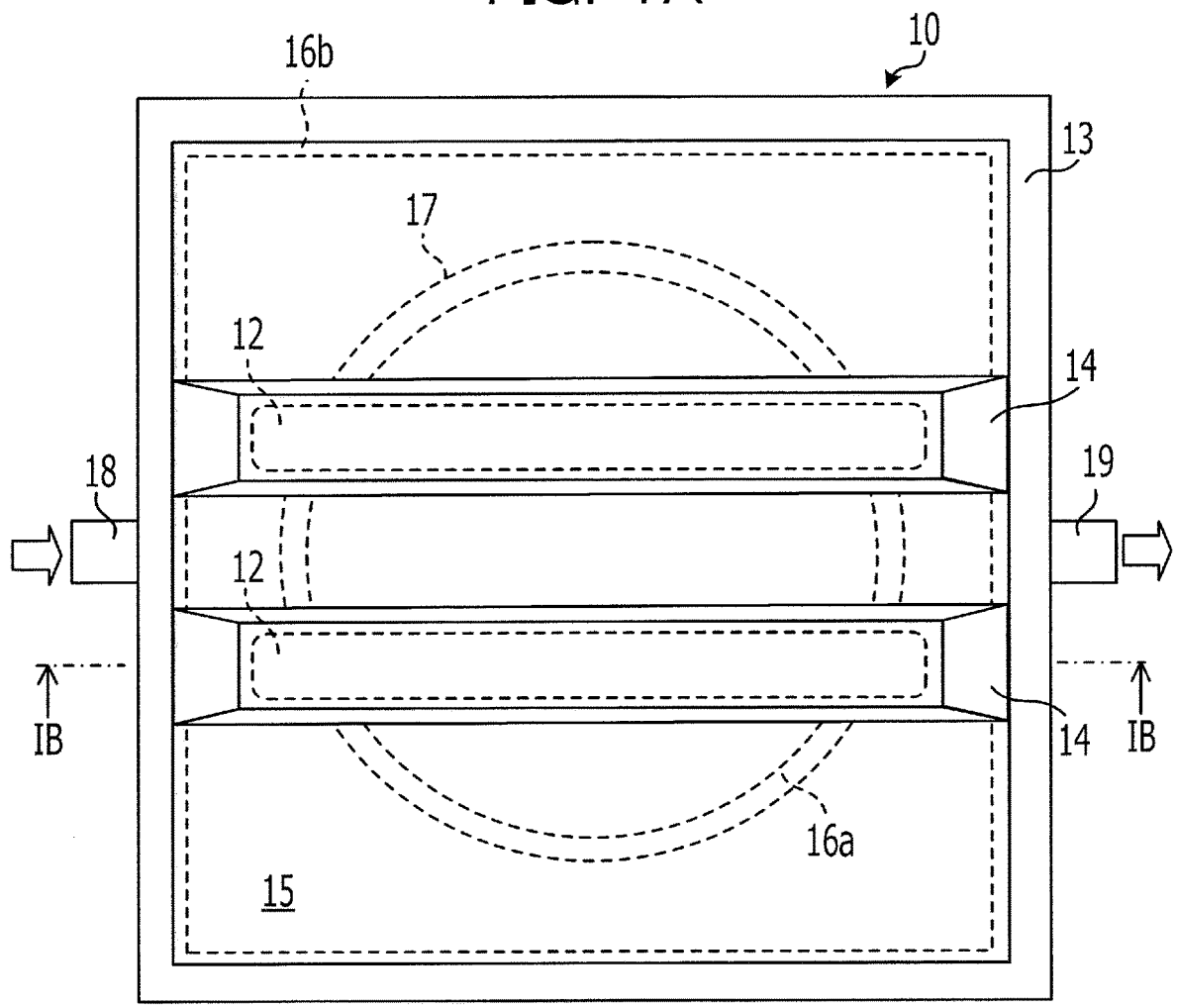
FIG. 1A and FIG. 1B illustrate an exemplary etching device.
Figure 1B:
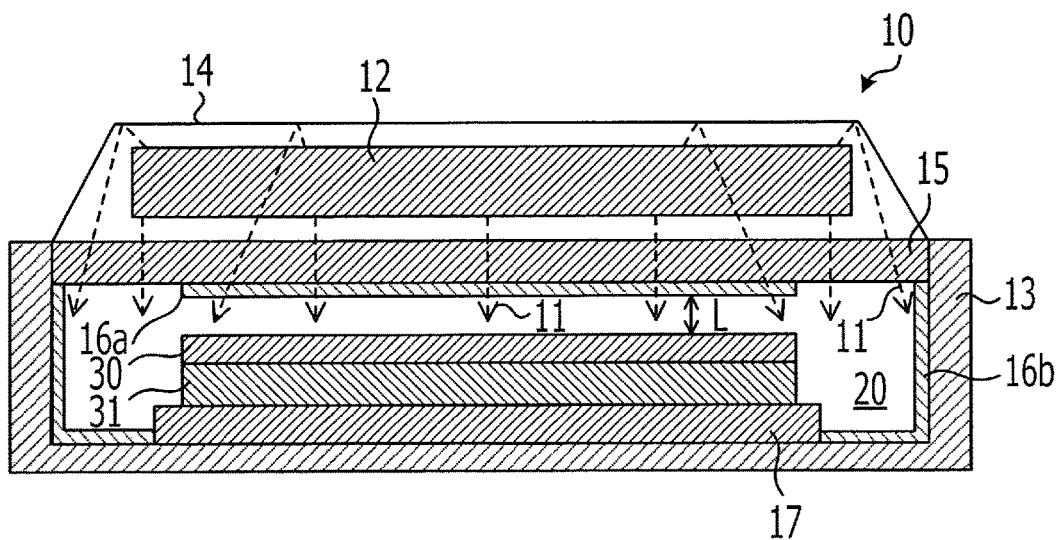

FIG. 1A and FIG. 1B illustrate an exemplary an etching device. FIG. 1A is a plan view and FIG. 1B is a sectional view of a section taken along the line IB-IB illustrated in FIG. 1A.

An etching device 10 illustrated in FIG. 1A and FIG. 1B includes radiation sources 12 to apply a radiation 11 to an etching aqueous solution 20 and an etching bath 13 to hold the etching aqueous solution 20 irradiated with the radiation 11. The etching device 10 may be used for the purpose of fabricating a semiconductor device.

A layer to be etched 30 etched by the etching device 10 may be, for example, a high dielectric film provided with a patterned resist layer. The layer to be etched 30 is formed on a semiconductor substrate 31. The shapes of both the layer to be etched 30 and the semiconductor substrate 31 may be a circle in plan view.

Examples of materials for forming the high dielectric film include aluminum oxide, hafnium oxide, zirconium oxide, and tantalum oxide.

In the etching device 10, the radiation 11 is applied to the etching aqueous solution 20, and an active species to functionalize the surface of a portion, which is exposed at an opening portion of the resist layer, of the layer to be etched 30 with a hydroxyl group (OH) is generated from the etching aqueous solution 20. Hydroxyl groups are formed on the surface of the layer to be etched 30 by the active species generated from the etching aqueous solution 20. The layer to be etched 30 having a surface functionalized with the hydroxyl group is dissolved by the etching aqueous solution 20 easily and, thereby, the etching rate is improved. The radiation 11 is continued to be applied to the etching aqueous solution 20, so that active species are generated continuously from the etching aqueous solution 20. Likewise, a fresh surface of the layer to be etched 30, which has been exposed to the etching aqueous solution 20 through etching of the layer to be etched 30, is also etched by the active species after a hydroxyl group is formed.

The radiation source 12 is disposed opposing to the layer to be etched 30. The radiation emitted from the radiation source 12 gives energy to a water molecule serving as a solvent of the etching aqueous solution 20 or a molecule forming a solute of the etching aqueous solution 20, so as to cut bonds in these molecules and generate active species. Examples of the radiation 11 emitted from the radiation source 12 may include electromagnetic waves, e.g., ultraviolet rays, corpuscular beams, e.g., electron beams, and the like.

As for the radiation source 12 of the etching device 10 illustrated in FIG. 1A and FIG. 1B, an ultraviolet lamp to emit ultraviolet rays may be used. The etching device 10 includes two ultraviolet lamps as the radiation sources 12. An electric power may be fed to the radiation source 12 from a power supply, although not illustrated in the drawing.

The etching aqueous solution 20 is held in an etching bath 13. A semiconductor 31 with the layer to be etched 30 is disposed in the inside of the etching bath 13, and the layer to be etched 30 is immersed in the etching aqueous solution 20. In the etching bath 13, the portion, which is exposed at the opening portion of the resist layer, of the layer to be etched 30 is etched with the etching aqueous solution 20 irradiated with the radiation 11.

The etching bath 13 includes a stage 17 to place the semiconductor substrate 31 with the layer to be etched 30. The semiconductor substrate 31 is fixed to the stage 17 through adsorption. The stage 17 is rotated by a rotation unit, although not illustrated in the drawing. The surface of the layer to be etched 30 may be etched uniformly by rotating the layer to be etched 30 in the etching aqueous solution 20.

The etching bath 13 includes a liquid feed pipe 18 to feed the etching aqueous solution 20 from the outside to the inside and a liquid discharge pipe 19 to discharge the etching aqueous solution 20 in the inside to the outside. A fresh etching aqueous solution 20 is fed into the etching bath 13 from the liquid feed pipe 18 and, in addition, etching products generated through etching of the layer to be etched 30 or an exhausted etching aqueous solution 20 is discharged from the liquid discharge pipe 19 to the outside.

The etching bath 13 includes radiation windows 15 to transmit the radiation 11 at portions opposing to the radiation sources 12.

The material for forming the radiation window 15 may be a material which transmits the radiation 11 and, in addition, which is not etched with the etching aqueous solution 20. In the case where ultraviolet rays are used as the radiation 11, for example, magnesium fluoride, calcium fluoride, or quartz glass may be used as the material for forming the radiation window 15. As for the quartz glass, synthesized quartz glass may be used.

A catalyst layer 16a including a catalyst, which facilitates generation of active species to functionalize the surface of the layer to be etched 30 with a hydroxyl group from the etching aqueous solution 20, is disposed inside the radiation windows 15. The etching device 10 applies the radiation 11 to the etching aqueous solution 20 through the catalyst layer 16a. The surface of the catalyst layer 16a may be in contact with the etching aqueous solution 20 held in the etching bath 13.

As illustrated in FIG. 1A, the catalyst layer 16a may be disposed in such a way as to cover the layer to be etched 30. In FIG. 1A, the shape in plan view of the catalyst layer 16a may be substantially equal or analogous to the shape of the layer to be etched 30, for example, the shape of a circle. The catalyst layer 16a scatters the applied radiation 11 to the direction parallel to the layer and, therefore, the catalyst layer 16a facilitates generation of the active species. The active species may be generated in the plane direction of the layer to be etched 30 uniformly.

A catalyst layer 16b including a catalyst, which facilitates generation of the active species to functionalize the surface of the layer to be etched 30 with a hydroxyl group from the etching aqueous solution 20, is disposed inside the etching bath 13 except the portions of the radiation windows 15 and the stage 17. The surface of the catalyst layer 16b may be in contact with the etching aqueous solution 20 held in the etching bath 13.

As illustrated in FIGS. 1A and 1B, the catalyst layer 16b is disposed in such a way as to surround the layer to be etched 30. Therefore, the active species are generated throughout the etching aqueous solution 20 and the resulting active species are fed to the layer to be etched 30.

The etching device 10 applies the radiation 11 to the catalyst layer 16a, the catalyst layer 16b, and the etching aqueous solution 20.

The catalyst for forming the catalyst layer 16a or the catalyst layer 16b may be titanium oxide or titanium oxide including at least one of antimony, chromium, and nickel.

The catalyst for forming the catalyst layer 16a or the catalyst layer 16b may be strontium titanate or strontium titanate including at least one of antimony, chromium, and nickel.

The catalyst layer 16a and the catalyst layer 16b may be formed by using substantially the same catalyst or be formed by using different catalysts.

The etching bath 13 may include an opening and closing unit, although not illustrated in the drawing, to open and close the radiation windows 15. The semiconductor substrate 31 including the layer to be etched 30 is taken into or taken out of the etching bath 13 by opening or closing of radiation windows 15 with the opening and closing unit.

The etching device 10 includes reflection portions 14 to reflect the radiation 11 applied from the radiation sources 12 and apply the radiation 11 to the etching aqueous solution 20.

The reflection portion 14 has a concave shape with an opening portion open toward the radiation window 15 and the radiation source 12 is disposed in the inside.

The reflection portion 14 is formed by using a material which reflects the radiation 11. For example, in the case where ultraviolet rays are used as the radiation 11, the reflection portion 14 may include a metal plate of aluminum or the like. In the case where the radiation source 12 has directivity with respect to the direction of emission of the radiation 11, the etching device 10 may not include the reflection portion 14.

As illustrated in FIG. 1B, the radiation 11 including ultraviolet rays is emitted in all directions from the radiation source 12 including the ultraviolet lamp. The radiation 11 emitted toward the opening portion of the reflection portion 14 is passed through the radiation window 15 and is applied to the etching aqueous solution 20 in the etching bath 13. The radiation 11 emitted in directions other than the direction toward the opening portion of the reflection portion 14 is reflected at the reflection portion 14 and is passed through the opening portion and the radiation window 15, so as to be applied to the etching aqueous solution 20 in the etching bath 13. Most of the radiation 11 passed through the radiation windows 15 is passed through the catalyst layer 16a and is applied to the etching aqueous solution 20. Generation of the active species is facilitated in the etching aqueous solution 20 in contact with the catalyst layer 16a.

The radiation 11 passed through a portion not provided with the catalyst layer 16a of the radiation windows 15 is not absorbed by the catalyst layer 16a and, therefore, may have high radiation intensity. The radiation 11 passed through a portion not provided with the catalyst layer 16a of the radiation windows 15 is passed through the etching aqueous solution 20 and reaches the catalyst layer 16b. Generation of the active species is facilitated in the etching aqueous solution 20 in contact with the catalyst layer 16b.

The etching aqueous solution 20 held in the etching bath 13 of the etching device 10 may be selected in accordance with, for example, the material for the layer to be etched 30 or the layer under the layer to be etched 30. For example, in the case where the layer to be etched 30 is a high dielectric film, examples of the etching aqueous solution 20 include a potassium hydroxide (KOH) aqueous solution, a sodium hydroxide (NaOH) aqueous solution, a hydrofluoric acid (HF) aqueous solution, an ozone ($O_3$) aqueous solution, a hydrogen peroxide ($H_2O_2$) aqueous solution, and a tetramethylammonium hydroxide (TMAH) aqueous solution.

The selectivity between the high dielectric film and the layer under the high dielectric film may be given to the etching aqueous solution by performing pH adjustment of the etching aqueous solution or adding a catalyst to the etching aqueous solution.

Examples of the active species, which is generated from the etching aqueous solution 20 irradiated with the radiation 11 and which functionalizes the surface of the layer to be etched 30 with a hydroxyl group, may include a hydroxyl radical (OH.) generated from a water molecule ($H_2O$) of the etching aqueous solution 20. The hydroxyl radical (OH.) may be generated from potassium hydroxide (KOH), sodium hydroxide (NaOH), or tetramethylammonium hydroxide (TMAH), which has a hydroxyl group, or hydrogen peroxide ($H_2O_2$).

Examples of active species may include active oxygen, e.g., super oxide anion ($.O_2^-$). The super oxide anion ($.O_2^-$) may be generated from, for example, an ozone ($O_3$) aqueous solution, a hydrogen peroxide ($H_2O_2$) aqueous solution, or dissolved oxygen ($O_2$) in an etching aqueous solution.

FIG. 2 illustrates an exemplary relationship between a chemical bond and a binding energy of an etching aqueous solution.

For example, regarding the water molecule ($H_2O$), the binding energy between H and OH is 4.6 eV. A radiation (ultraviolet ray), which is an electromagnetic wave with a wavelength of 268 nm, is applied to a water molecule ($H_2O$), and a hydroxyl radical (OH.) is generated through direct transition. The radiation may be corpuscular beams, e.g., an electron beam, having incident energy of 4.6 eV. Regarding the direct transition, the energy held by the radiation may be used for cutting a chemical bond.

An electromagnetic wave having energy larger than the binding energy between H and OH (4.6 eV) and a wavelength smaller than 268 nm may be applied to the etching aqueous solution and a hydroxyl radical (OH.) may be generated through indirect transition. As for the radiation, corpuscular beams, e.g., an electron beam having incident energy larger than 4.6 eV may be used. Regarding indirect transition, the radiation may have energy larger than the binding energy of the chemical bond to be cut in order to generate the active species. Regarding indirect transition, for example, the energy held by the radiation may be absorbed at some other place and, thereafter, a part of the absorbed energy may be used for cutting a chemical bond in order to generate the active species.

FIG. 3 illustrates an exemplary facilitation mechanism of generation of active species. In FIG. 3, generation of the active species is facilitated by the catalyst. As for the catalyst to form the catalyst layers 16a and 16b, titanium oxide ($TiO_2$) may be used.

As illustrated in FIG. 3, a radiation (energy hv) is applied to titanium oxide. A pair of hole and electron is generated from two molecules of titanium oxide which have received the energy, so that a titanium oxide molecule having a hole ($TiO_2(h^+)$) and a titanium oxide molecule having an electron ($TiO_2(e^-)$) are formed, where h represents the Planck constant and v represents a frequency of the radiation.

The titanium oxide molecule having a hole ($TiO_2(h^+)$) and a water molecule ($H_2O$) are reacted, so that a titanium oxide molecule ($TiO_2$), a hydrogen ion ($H^+$), and a hydroxyl radical (OH.) are generated.

In the case where titanium oxide is present, the activation energy may be reduced as compared with that in the case where a hydroxyl radical (OH.) is generated from only a water molecule ($H_2O$). Consequently, generation of the hydroxyl radical (OH.) may be facilitated.

The etching device 10 applies the radiation 11 to the etching aqueous solution 20 and, thereby, a solute of the etching aqueous solution 20 is dissociated. The dissociated solute facilitates etching of the layer to be etched 30.

As illustrated in FIG. 2, for example, regarding a hydrofluoric acid (HF) aqueous solution, the binding energy between H and F in hydrofluoric acid (HF) serving as a solute is 5.6 eV. The hydrofluoric acid (HF) aqueous solution may be dissociated into H and F through direct transition by application of a radiation (ultraviolet ray), which is an electromagnetic wave with a wavelength of 220 nm, to the hydrofluoric acid (HF) aqueous solution. Corpuscular beams, e.g., an electron beam, may be used for the dissociation of the solute. The solute may be dissociated through indirect transition.

In the etching device 10, the radiation 11 may not be applied to the layer to be etched 30. When the radiation 11 is applied to the surface of the layer to be etched 30, the chemical bond of the layer to be etched 30 may be cut so that a dangling bond may be formed or the surface may be damaged. For example, when a dangling bond is present on the surface of a high dielectric film serving as a gate insulating film of a transistor element, a surface level due to the dangling bond is formed. The surface level serves as a center of recombination of carrier and the electrical characteristics of the gate insulating film may be degraded.

FIG. 4 illustrates an exemplary relationship between a chemical bond and a binding energy of a layer to be etched.

As illustrated in FIG. 4, for example, the binding energy between Al and O in aluminum oxide is 5.3 eV and, therefore, Al and O may be dissociated by being irradiated with a radiation corresponding to an electromagnetic wave, for example, ultraviolet rays, with a wavelength of 234 nm. The binding energy between Hf and O in hafnium oxide is 8.3 eV and, therefore, Hf and O may be dissociated by being irradiated with a radiation corresponding to an electromagnetic wave, for example, ultraviolet rays, with a wavelength of 149 nm.

In the etching device 10, the distance L between the catalyst layer 16a and the layer to be etched 30 is specified in such a way that the radiation 11 is not applied to the layer to be etched 30.

The radiation 11 is absorbed by the etching aqueous solution 20. Therefore, when the distance L between the catalyst layer 16a and the layer to be etched 30 is large, arrival of the radiation 11 at the layer to be etched 30 may be reduced.

The distance L between the catalyst layer 16a and the layer to be etched 30 may be small since the active species generated on the surface of the catalyst layer 16a move to the surface of the layer to be etched 30 promptly.

In the etching device 10, the absorptance of the radiation 11 by the catalyst layer 16a is adjusted and the etching aqueous solution 20 absorbs the radiation 11. Consequently, application of the radiation 11 to the layer to be etched 30 may be reduced.

For example, the distance L between the catalyst layer 16a and the layer to be etched 30 may be set at the position where the radiation 11 is attenuated sufficiently through absorption by the etching aqueous solution 20. The position where the radiation 11 is attenuated sufficiently through absorption by the etching aqueous solution 20 may corresponds to the position where the radiation 11 may not cut the chemical bond of the layer to be etched 30. The intensity of the radiation 11 at which the chemical bond of the layer to be etched 30 may not be cut may be, for example, the ultraviolet intensity measured with an illuminometer may be less than or equal to the lower limit value of measurement.

Figure 5:
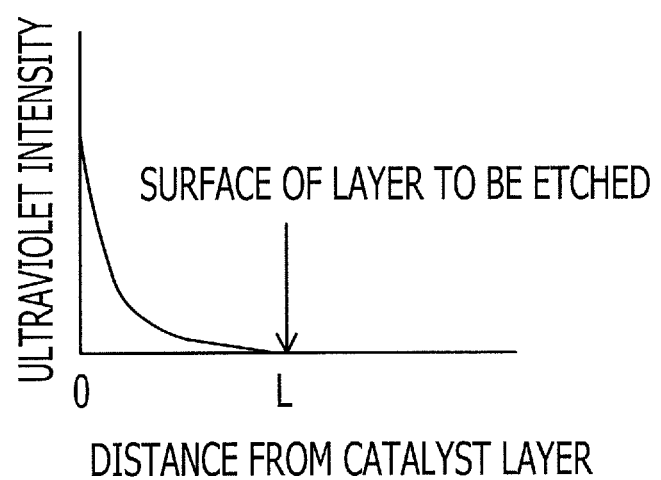
FIG. 5 illustrates an exemplary relationship between a distance from a catalyst layer and an ultraviolet intensity.

FIG. 5 illustrates an exemplary relationship between a distance from a catalyst layer and the ultraviolet ray intensity. The ultraviolet ray may be a radiation 11.

As illustrated in FIG. 5, in the etching device 10, the surface of the layer to be etched 30 is disposed at the position where the ultraviolet ray is attenuated sufficiently through absorption by the etching aqueous solution 20.

The amount of absorption of the radiation 11 by the catalyst layer 16a may be larger than the amount of absorption of radiation by the etching aqueous solution 20 in the portion between the catalyst layer 16a and the layer to be etched 30. The amount of absorption of the radiation 11 by the catalyst layer 16a may be larger than the amount of absorption of water by the etching aqueous solution 20. The amount of absorption of the radiation by the etching aqueous solution 20 between the catalyst layer 16a and the layer to be etched 30 may be reduced. Since the distance L between the catalyst layer 16a and the layer to be etched 30 is reduced, the active species generated in the catalyst layer 16a may be fed into the plane of the layer to be etched 30 sufficiently. The amount of absorption of the radiation 11 by the catalyst layer 16a may be increased by selection of the material for the catalyst layer 16a or adjustment of the thickness of the catalyst layer 16a.

The etching rate of the etching device 10 may be improved. When the etching device 10 performs etching of a high dielectric film with the etching aqueous solution 20, the time for forming a gate oxide film of the transistor element is reduced.

In the etching device 10, the surface of the layer to be etched 30 is etched uniformly because the radiation 11 is applied to the layer to be etched 30 in a face-to-face manner. The catalyst layer 16a is disposed in such a way as to cover the whole layer to be etched 30 and, in addition, the catalyst layer 16b surrounds the layer to be etched 30. Therefore, functionalization with the hydroxyl group is performed while the active species are fed to the surface of the layer to be etched 30 uniformly and sufficiently. Consequently, the surface of the layer to be etched 30 is etched more uniformly.

Figure 6:
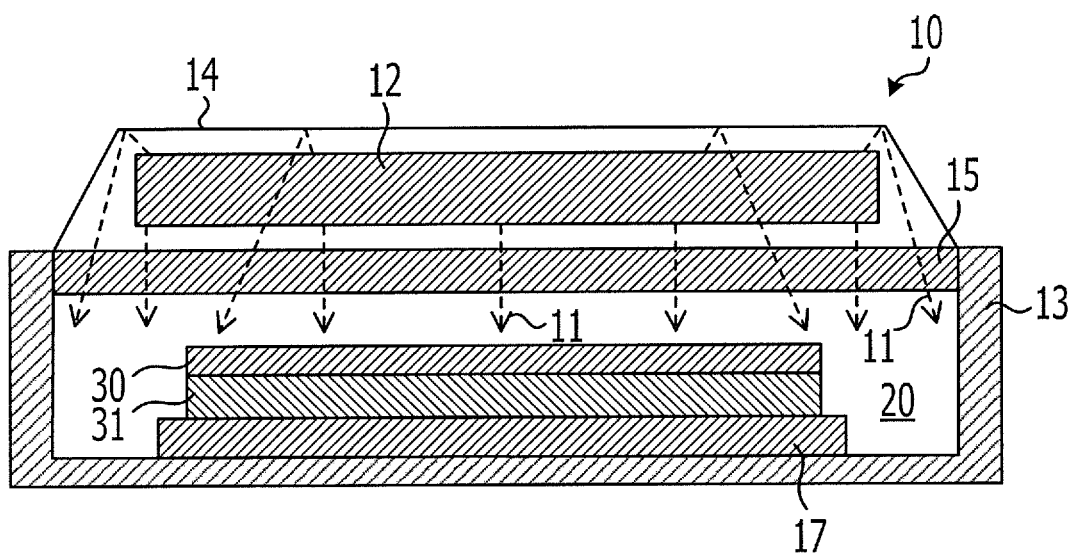
FIG. 6 illustrates an exemplary etching device.

FIG. 6 illustrates an exemplary etching device. FIG. 6 is a sectional view of the etching device.

The etching device 10 illustrated in FIG. 6 does not include the catalyst layer 16a nor catalyst layer 16b. The structure illustrated in FIG. 6 may be substantially the same or similar to the structure of the etching device illustrated in FIGS. 1A and 1B.

A catalyst layer is not disposed inside the radiation window 15. Therefore, the radiation 11 is applied to the etching aqueous solution 20 and, in addition, the material to be etched. The radiation 11 is not absorbed by a catalyst layer. The amount of generation of active species increases because the radiation 11 activates the etching aqueous solution 20 directly.

For example, the layer to be etched 30 is removed from the semiconductor substrate 31 through etching and, thereby, the semiconductor substrate 31 may be regenerated. The layer to be etched 30 is removed. Therefore, a dangling bond may be formed in the layer to be etched 30 irradiated with the radiation 11 or the layer to be etched 30 may be damaged. A resist layer may not be formed on the layer to be etched 30. Alternatively, a resist layer may be removed.

Figure 7A:
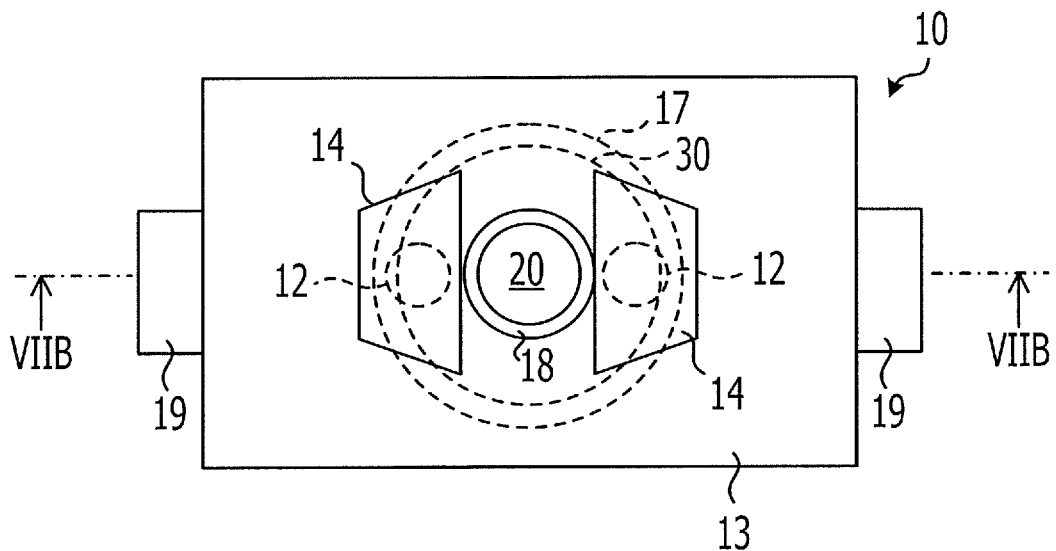
FIG. 7A and FIG. 7B illustrate an exemplary etching device.
Figure 7B:
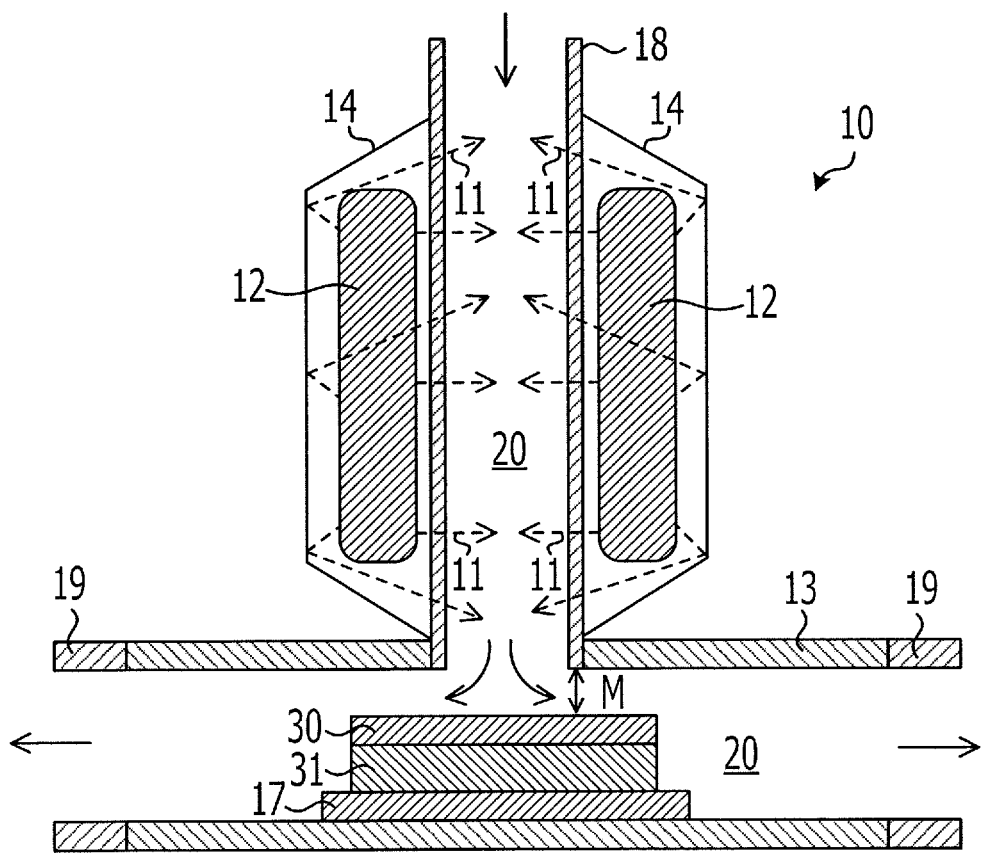

FIG. 7A and FIG. 7B illustrate an exemplary etching device. FIG. 7A is a plan view of the etching device. FIG. 7B is a sectional view of a section taken along the line VIIB-VIIB illustrated in FIG. 7A.

The etching device 10 includes a liquid feed pipe 18 which transmits the radiation 11 and which feeds the etching aqueous solution 20 into the etching bath 13. The radiation sources 12 apply the radiation 11 to the etching aqueous solution 20 by passing the radiation 11 through the liquid feed pipe 18. The other configurations may be substantially the same or similar to the configurations illustrated in FIGS. 1A and 1B.

The liquid feed pipe 18 transmits the radiation 11 and, in addition, may include a material which is not etched with the etching aqueous solution 20. When ultraviolet rays are used as the radiation 11, examples of the materials for the liquid feed pipe 18 may include magnesium fluoride, calcium fluoride, and quartz glass. The quartz glass may be synthesized quartz glass.

The shape of the liquid feed pipe 18 of the etching device 10 illustrated in FIG. 7A may be a circular cylinder. The liquid feed pipe 18 is disposed in such a way as to be located at the center of the circular layer to be etched 30 and is piped to the etching bath 13.

In the etching device 10, two portrait radiation sources 12 are disposed oppositely with the liquid feed pipe 18 therebetween. Each radiation source 12 is disposed along the side surface of the portrait liquid feed pipe 18. The radiation 11 emitted from the radiation source 12 is applied to the liquid feed pipe 18 directly or after being reflected at a reflection portion 14. The radiation 11 passed through the liquid feed pipe 18 is applied to the etching aqueous solution 20 in the liquid feed pipe 18.

In the liquid feed pipe 18, active species to functionalize the surface of the layer to be etched 30 with the hydroxyl group are generated from the etching aqueous solution 20 irradiated with the radiation 11.

As illustrated in FIG. 7B, the etching aqueous solution 20 is fed to the liquid feed pipe 18 from above. The etching aqueous solution 20 irradiated with the radiation 11 in the liquid feed pipe 18 flows together with generated active species from the bottom of the liquid feed pipe 18 toward the layer to be etched 30 in the etching bath 13. The radiation 11 may not be applied to the layer to be etched 30 directly.

In the etching bath 13, the layer to be etched 30 is fixed to the stage 17 through adsorption with the semiconductor substrate 31 therebetween. The etching aqueous solution 20 is fed to the layer to be etched 30 together with the active species from the liquid feed pipe 18 disposed above. The surface of the portion, which is exposed at an opening portion of a resist layer, of the layer to be etched 30 is functionalized with the hydroxyl group and, in addition, is etched.

The etching bath 13 includes liquid discharge pipes 19, which discharge the etching aqueous solution 20 from the inside, at the individual end portions opposite to each other. Etching products generated through etching of the layer to be etched 30 or an exhausted etching aqueous solution 20 is discharged from the liquid discharge pipe 19 to the outside.

The distance M between the liquid feed pipe 18 and the surface of the layer to be etched 30 may refer to a distance between the lower end portion, which is coupled to the etching bath 13, of the liquid feed pipe 18 and the surface of the layer to be etched 30.

The radiation 11 may not be applied to the layer to be etched 30 directly, but a part of the radiation 11 may enter the etching bath 13 in the vicinity of the lower end portion of the liquid feed pipe 18. The distance M between the liquid feed pipe 18 and the surface of the layer to be etched 30 may be specified in such a way that the radiation 11 is not applied to the layer to be etched 30.

The distance M between the lower end portion of the liquid feed pipe 18 and the surface of the layer to be etched 30 may be small since the active species generated in the liquid feed pipe 18 move to the surface of the layer to be etched 30 promptly.

In the etching device 10, the etching aqueous solution 20 absorbs the radiation 11 and, therefore, the layer to be etched 30 may not be irradiated with the radiation 11.

For example, the distance M between the liquid feed pipe 18 and the surface of the layer to be etched 30 may be set at the position where the radiation 11 is attenuated sufficiently through absorption by the etching aqueous solution 20.

The etching bath 13 may include an opening and closing unit, although not illustrated in the drawing, to open and close a part of the etching bath 13. The semiconductor substrate 31 including the layer to be etched 30 is taken into or is taken out of the etching bath 13 by the opening or closing unit.

The etching device 10 reduces application of the radiation 11 to the layer to be etched 30. The etching rate of the etching device 10 may be improved.

A catalyst layer may be disposed inside the liquid feed pipe 18 of the etching device 10 illustrated in FIGS. 7A and 7B.

Figure 8:
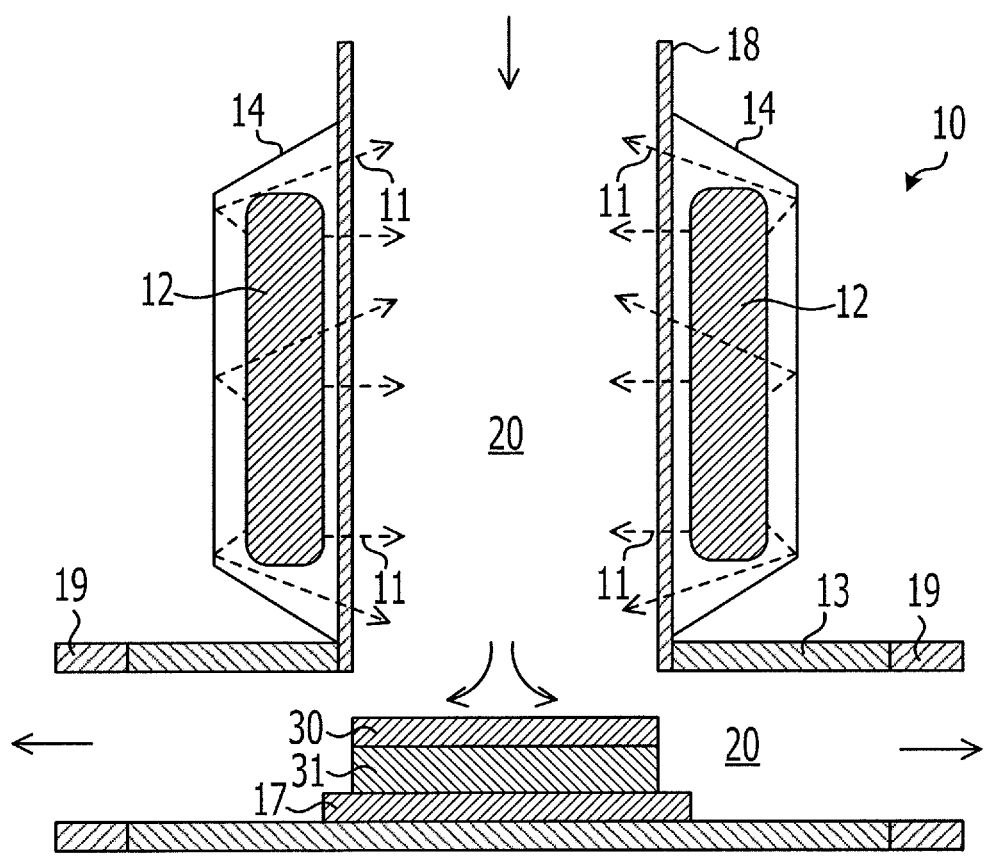
FIG. 8 illustrates an exemplary etching device.

FIG. 8 illustrates an exemplary etching device.

The inside diameter of the liquid feed pipe 18 of the etching device 10 may be substantially equal to the diameter of the layer to be etched 30. The etching aqueous solution 20 is fed together with the active species to all over the surface of the layer to be etched 30 from the liquid feed pipe 18 disposed above.

Regarding the etching device 10 illustrated in FIG. 8, the etching rate of the surface of the layer to be etched 30 may become uniform.

The inside diameter of the liquid feed pipe 18 may be larger than the diameter of the layer to be etched 30.

Figure 9:
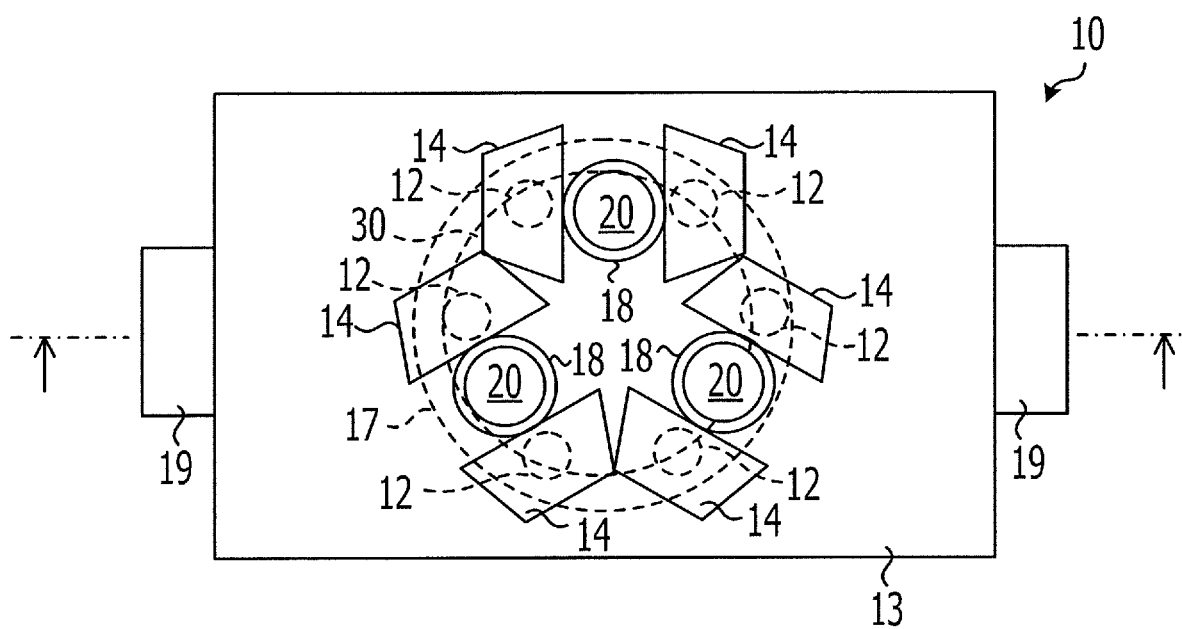
FIG. 9 illustrates an exemplary etching device.

FIG. 9 illustrates an exemplary etching device.

The etching device 10 illustrated in FIG. 9 includes a plurality of liquid feed pipes 18. Each liquid feed pipe 18 is provided with radiation sources 12 opposite to each other. Each radiation source 12 is provided with a reflection portion 14. The etching device 10 illustrated in FIG. 9 includes three liquid feed pipes 18. The individual liquid feed pipes 18 are disposed at positions which divide the layer to be etched 30 into 3 equal parts in the circumferential direction. The etching aqueous solution 20 is fed uniformly together with the active species to the layer to be etched 30.

The etching device 10 illustrated in FIG. 9 includes a plurality of liquid feed pipes 18 and, therefore, the etching aqueous solution 20 including the active species is fed to the layer to be etched 30. Functionalization of the surface of the layer to be etched 30 with the hydroxyl group may be further facilitated and the etching rate may be improved. In the etching device 10, the etching aqueous solution 20 is fed uniformly together with the active species to the layer to be etched 30 from the plurality of liquid feed pipes 18. Consequently, the layer to be etched 30 is etched with good in-plane uniformity.

The etching rate of the layer to be etched and the in-plane uniformity of etching of the etching device illustrated in FIGS. 1A and 1B are measured.

As for the material for forming a layer to be etched, aluminum oxide was used. The layer to be etched having a thickness of 40 nm was formed on a silicon substrate having a diameter of 3 inches. A resist layer was not formed on the layer to be etched. As for an etching aqueous solution, a hydrofluoric acid aqueous solution having a concentration of 10 percent by mass was used. As for a radiation source, an ultraviolet lamp with a wavelength of 172 nm was used. The ultraviolet irradiance at a position of an outside surface of a radiation window of the etching device was 10 mW/cm$^2$. The distance between the catalyst layer 16a and the layer to be etched 30 was 2 mm. The etching time was 5 minutes. The layer to be etched was etched with the etching device (Etching 1).

As for an etching aqueous solution, a potassium hydroxide aqueous solution having a concentration of 6 percent by mass was used, and other etching conditions were specified to be substantially the same as those in Etching 1 (Etching 2).

As for an etching aqueous solution, a TMAH aqueous solution having a concentration of 2.38 percent by mass was used, and other etching conditions were specified to be substantially the same as those in Etching 1 (Etching 3).

As for the material for a layer to be etched, hafnium oxide was used, and other etching conditions were specified to be substantially the same as those in Etching 1 (Etching 4).

Ultraviolet rays were not applied to an etching aqueous solution, and other etching conditions were specified to be substantially the same as those in Etching 1 (Etching 5).

Ultraviolet rays were not applied to an etching aqueous solution, and other etching conditions were specified to be substantially the same as those in Etching 2 (Etching 6).

Ultraviolet rays were not applied to an etching aqueous solution, and other etching conditions were specified to be substantially the same as those in Etching 3 (Etching 7).

Ultraviolet rays were not applied to an etching aqueous solution, and other etching conditions were specified to be substantially the same as those in Etching 4 (Etching 8).

The thicknesses of the layers to be etched in Etching 1 to Etching 8 were measured with an ellipsometer. The measurement of the thickness was performed at nine points in total of the center of the circular layer to be etched and positions located at one-half of radius and in the vicinity of the edge, where center angles were 0 degrees, 90 degrees, 180 degrees, and 270 degrees. The etching rate was specified to be the value obtained by dividing the amount of decrease in thickness at each of the nine measurement points by the etching time. The average etching rate was specified to be the average value of etching rates at the nine measurement points.

The in-plane uniformity of etching rate was determined by using the etching rates at the nine measurement points. The in-plane uniformity was calculated as a difference between the maximum value and the minimum value of the etching rates at the nine measurement points.

FIG. 10 illustrates an exemplary average etching rate and in-plane uniformity. FIG. 10 indicates the average etching rate and the in-plane uniformity in each of Etching 1 to Etching 8.

As illustrated in FIG. 10, the average etching rates in Etching 1 to Etching 4 are larger than the average etching rates in Etching 5 to Etching 8, and the uniformity is equal to or better than that in Etching 5 to Etching 8.

Figure 11:
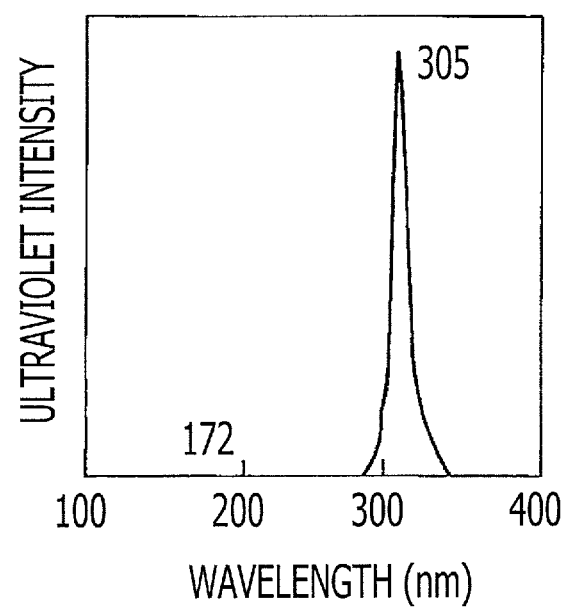
FIG. 11 illustrates an exemplary emission spectrum.

An illuminometer was disposed at the position of the layer to be etched in the same manner as in Etching 1, and the ultraviolet intensity at the position of the surface of the layer to be etched and the emission spectrum of the active species were measured. FIG. 11 illustrates an exemplary emission spectrum.

FIG. 11 illustrates the ultraviolet intensity at the position of the surface of the layer to be etched and the emission spectrum of the active species.

As illustrated in FIG. 11, at a wavelength of 172 nm, the ultraviolet intensity was lower than or equal to the lower limit value of measurement and, therefore, ultraviolet rays did not reach the surface of the layer to be etched, so that ultraviolet rays were not applied to the surface of the layer to be etched. At a wavelength of 305 nm, a peak of emission spectrum of hydroxyl radical (OH.) serving as an active species was detected, so that the hydroxyl radical (OH.) reached the surface of the layer to be etched.

The etching rate of the layer to be etched was measured by using the etching device illustrated in FIGS. 7A and 7B.

As for the material for forming a layer to be etched, aluminum oxide was used. The layer to be etched having a thickness of 40 nm was formed on a silicon substrate having a diameter of 3 inches. The inside diameter of the liquid feed pipe was 4 cm. As for an etching aqueous solution, a hydrofluoric acid aqueous solution having a concentration of 10 percent by mass was used. As for a radiation source, an ultraviolet lamp with a wavelength of 172 nm was used. The ultraviolet irradiance on the outside surface of the liquid feed pipe of the etching device was 10 mW/cm$^2$. The distance between the lower end portion of the liquid feed pipe and the surface of the layer to be etched was 2 mm. The etching time was 5 minutes. The layer to be etched was etched with the etching device (Etching 11).

As for an etching aqueous solution, a potassium hydroxide aqueous solution having a concentration of 6 percent by mass was used, and other etching conditions were specified to be substantially the same as those in Etching 11 (Etching 12).

As for an etching aqueous solution, a TMAH aqueous solution having a concentration of 2.38 percent by mass was used, and other etching conditions were specified to be substantially the same as those in Etching 11 (Etching 13).

As for the material for a layer to be etched, hafnium oxide was used, and other etching conditions were specified to be substantially the same as those in Etching 11 (Etching 14).

Ultraviolet rays were not applied to an etching aqueous solution, and other etching conditions were specified to be substantially the same as those in Etching 11 (Etching 15).

Ultraviolet rays were not applied to an etching aqueous solution, and other etching conditions were specified to be substantially the same as those in Etching 12 (Etching 16).

Ultraviolet rays were not applied to an etching aqueous solution, and other etching conditions were specified to be substantially the same as those in Etching 13 (Etching 17).

Ultraviolet rays were not applied to an etching aqueous solution, and other etching conditions were specified to be substantially the same as those in Etching 14 (Etching 18).

The average etching rates of the layers to be etched in Etching 11 to Etching 18 were determined in the same manner as that in Etching 1 to Etching 8.

FIG. 12 illustrates an exemplary average etching rate. The etching rates illustrated in FIG. 12 indicate the average etching rates in Etching 11 to Etching 18.

As illustrated in FIG. 12, the average etching rates in Etching 11 to Etching 14 are larger than the average etching rates in Etching 15 to Etching 18.

Example of embodiments of the present invention have now been described in accordance with the above advantages. It will be appreciated that these examples are merely illustrative of the invention. Many variations and modifications will be apparent to those skilled in the art.

The invention claimed is:

1. An etching device comprising:
   a radiation source to apply a radiation to an etching aqueous solution;
   an etching bath to hold the etching aqueous solution to be irradiated with the radiation from the radiation source provided outside the etching bath through a radiation window provided at an upper portion of the etching bath;
   a first catalyst layer being different from the etching aqueous solution and provided in the etching bath in such a manner that a first surface of the first catalyst layer is in contact with an inner surface of the radiation window and a second surface of the first catalyst layer opposite to the first surface is exposed to the etching aqueous solution in the etching bath; and
   a second catalyst layer disposed at an inner sidewall and an inner bottom of the etching bath,
   wherein the first catalyst layer is made of titanium oxide (TiO$_2$), the radiation window is made of an insulating material which transmits the radiation, and the radiation is irradiated to an outer surface of the radiation window which is opposite to the inner surface of the radiation window with which the first catalyst is in contact.

2. The etching device according to claim 1, further comprising,
   a reflection portion to reflect the radiation emitted from the radiation source and apply the radiation to the etching aqueous solution.

3. The etching device according to claim 1, wherein the radiation window is provided at an upper portion of the etching bath and transmits the radiation from the radiation source provided above the etching bath.

4. The etching device according to claim 1, further comprising,
   a liquid feed pipe to feed the etching aqueous solution to the etching bath, and the radiation source applies the radiation to the etching aqueous solution.

5. The etching device according to claim 1, wherein each of areas of the first surface and the second surface is smaller than an area of a surface of the radiation window and each of shapes of the first surface and the second surface is different from a shape of the surface of the radiation window.

6. The etching device according to claim 1, wherein the insulating material is one of magnesium fluoride, calcium fluoride and quartz glass.

* * * * *